US012713815B2

(12) United States Patent
Kim et al.

(10) Patent No.: US 12,713,815 B2
(45) Date of Patent: Aug. 18, 2026

(54) DISPLAY APPARATUS

(71) Applicant: LG DISPLAY CO., LTD., Seoul (KR)

(72) Inventors: Ho-Jin Kim, Paju-si (KR); Han-Sun Park, Paju-si (KR); Pu-Reum Kim, Paju-si (KR); Dong-Wook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 596 days.

(21) Appl. No.: 18/087,863

(22) Filed: Dec. 23, 2022

(65) Prior Publication Data

US 2023/0217694 A1 Jul. 6, 2023

(30) Foreign Application Priority Data

Dec. 30, 2021 (KR) ........................ 10-2021-0192483

(51) Int. Cl.

| | |
|---|---|
| ***H10K 50/858*** | (2023.01) |
| ***H10K 50/852*** | (2023.01) |
| ***H10K 59/80*** | (2023.01) |
| *H10K 59/12* | (2023.01) |
| *H10K 59/35* | (2023.01) |

(52) U.S. Cl.

CPC ......... *H10K 59/879* (2023.02); *H10K 59/876* (2023.02); *H10K 59/12* (2023.02); *H10K 59/351* (2023.02)

(58) Field of Classification Search

CPC .... H10K 59/879; H10K 59/876; H10K 59/12; H10K 59/351; H10K 59/38; H10K 59/35; H10K 59/00–95; H10K 50/852; H10K 50/858; H10K 50/8445; H10K 50/00–88

See application file for complete search history.

(56) References Cited

U.S. PATENT DOCUMENTS

| | | | | |
|---|---|---|---|---|
| 2014/0077185 | A1* | 3/2014 | Lee | H10K 59/30 257/40 |
| 2014/0183471 | A1* | 7/2014 | Heo | H10K 50/13 257/40 |
| 2015/0165347 | A1 | 6/2015 | Baek et al. | |
| 2018/0151842 | A1* | 5/2018 | Park | H10K 59/8792 |
| 2020/0185650 | A1* | 6/2020 | Lim | H10K 59/122 |

(Continued)

FOREIGN PATENT DOCUMENTS

| | | |
|---|---|---|
| CN | 101266996 A | 9/2008 |
| CN | 104681590 A | 6/2015 |

(Continued)

OTHER PUBLICATIONS

UK Examination Report dated Jan. 25, 2024, issued in Patent Application No. GB2219234.8 (6 pages).

(Continued)

*Primary Examiner* — Steven B Gauthier
*Assistant Examiner* — Rhys Poniente Sheker
(74) *Attorney, Agent, or Firm* — Fish & Richardson P.C.

(57) ABSTRACT

The present disclosure is directed to a display apparatus having a high resolution with improved light efficiency. In one aspect, such display apparatus includes a substrate, a light emitting element formed on the substrate and configured to emit light of different colors via a plurality of sub-pixels, and a partial color filter layer formed on a first subset of the plurality of sub-pixels configured to output at least two of the different colors.

20 Claims, 9 Drawing Sheets

(56) References Cited

U.S. PATENT DOCUMENTS

| | | | | |
|---|---|---|---|---|
| 2020/0203667 | A1 | 6/2020 | Youn et al. | |
| 2020/0211477 | A1* | 7/2020 | Lai | G09G 3/3258 |
| 2021/0028243 | A1* | 1/2021 | Yang | H10K 59/30 |

FOREIGN PATENT DOCUMENTS

| | | | | |
|---|---|---|---|---|
| CN | 105870354 | A | 8/2016 | |
| CN | 108123061 | A | 6/2018 | |
| EP | 1759429 | B1 | 10/2008 | |
| JP | 2012199231 | A | 10/2012 | |
| JP | 2013191464 | A | 9/2013 | |
| JP | 2020092088 | A | 6/2020 | |
| KR | 20100036908 | A * | 4/2010 | H10K 59/351 |
| KR | 1020100036908 | A | 4/2010 | |
| KR | 10-2010-0069337 | A | 6/2010 | |
| KR | 20120100813 | A | 9/2012 | |
| KR | 20200069480 | A | 6/2020 | |
| TW | 200638070 | A | 11/2006 | |
| WO | 2009025745 | A1 | 2/2009 | |

OTHER PUBLICATIONS

GB Combined Search and Examination Report dated Jun. 16, 2023, issued in Patent Application No. 2219234.8 (11 pages).

Office Action in Taiwanese Appln. No. 113128552, mailed on Jul. 15, 2025, 11 pages (with English translation).

Japanese Office Action dated Jan. 9, 2024, issued in Patent Application No. 2022-210197 (15 pages).

Taiwanese Office Action dated Jan. 19, 2024, issued in Patent Application No. 111150323 (9 pages).

Office Action in Korean Appln. No. 10-2021-0192483, mailed on Aug. 16, 2025, 15 pages (with English translation).

* cited by examiner

FIG. 5

DISPLAY APPARATUS

CROSS-REFERENCE TO RELATED APPLICATION

The present application claims priority to Korean Patent Application No. 10-2021-0192483 filed in Republic of Korea on Dec. 30, 2021, which is hereby incorporated by reference in its entirety.

BACKGROUND

Field of the Disclosure

The present disclosure relates to a high-resolution display apparatus having improved light efficiency.

Description of the Background

Various types of flat display apparatuses such as a liquid crystal display apparatus, a plasma display apparatus, and an organic electroluminescent display apparatus have been commercialized. Among these flat display apparatuses, an organic electroluminescent display apparatus is currently widely used in that it has a high response speed, a high luminance and a good viewing angle.

On the other hand, recently, as virtual reality and augmented reality has attracted a lot of attention, demand for a high-resolution and compact display apparatus for implementing virtual reality and augmented reality is increased. However, it is difficult to satisfy such high resolution and compactness with the prior art organic electroluminescent display apparatus.

SUMMARY

Accordingly, the present disclosure is directed to a display apparatus that substantially obviates one or more of the problems due to limitations and disadvantages of the related art.

An advantage of the present disclosure is to provide a display apparatus which can implement a high resolution and improve light efficiency thereof.

In one aspect, a display apparatus includes a substrate, a light emitting element formed on the substrate and configured to emit light of different colors via a plurality of sub-pixels, and a partial color filter layer formed on a first subset of the plurality of sub-pixels configured to output at least two of the different colors.

In another aspect, the display apparatus further includes an air layer over a second subset of the plurality of sub-pixels over which the partial color filter layer is not formed, the second subset of the plurality of sub-pixels configured to output one of the different colors.

In another aspect, the air layer has a different refractive index than a color filter of the partial color filter layer.

In another aspect, the different colors include red, green, and blue colors, each of the plurality of sub-pixels correspond to one of the red, green, and blue colors, the first subset of the plurality of sub-pixels includes sub-pixels corresponding to two of the red, green, and blue colors, and the second subset of the plurality of sub-pixels includes sub-pixels correspond to a remaining one of the red, green, and blue colors.

In another aspect, the light emitting element includes a plurality of first electrodes, each of the plurality of first electrodes corresponding to one of the plurality of sub-pixels, a light emitting layer formed over an entire surface of the substrate to cover the plurality of first electrodes, and a second electrode formed over the light emitting layer.

In another aspect, the display apparatus further includes a passivation layer, a insulating layer formed over the passivation layer, a first reflective electrode formed on the passivation layer corresponding to the second subset of the plurality of sub-pixels, and a second reflective electrode formed on the insulating layer corresponding to the first subset of the plurality of sub-pixels.

In another aspect, an optical distance between the first reflective electrode and the second electrode is adjusted to cause constructive interference for light reflected between the first reflective electrode and the second electrode within a wavelength band of a color to be emitted from the second subset of the plurality of sub-pixels.

In another aspect, the optical distance, when adjusted, causes destructive interference for all other lights within wavelength bands of colors other than the color.

In another aspect, the display apparatus further includes a first insulating layer, a passivation layer formed on the first insulating layer, a second insulating layer formed on the passivation layer, a first reflective electrode formed on the first insulating layer corresponding to the second subset of the plurality of sub-pixels, and a second reflective electrode formed on the second insulating layer corresponding to the first subset of the plurality of sub-pixels.

In another aspect, the display apparatus further includes an encapsulation layer configured to prevent moisture from penetrating into the light emitting element.

In another aspect, the display apparatus further includes a plurality of transistor, each of the plurality of transistors having an active region inside the substrate.

In one aspect, a display apparatus for displaying multimedia representing virtual and augmented reality includes a substrate, a light emitting element formed on the substrate and configured to emit light of different colors via a plurality of sub-pixels to display the multimedia on the display apparatus, and a color filter layer over the light emitting element, and a plurality of reflective electrodes, wherein at least one of the plurality of reflective electrodes is at a first distance from the color filter layer and remaining ones of the plurality of reflective electrodes are at a second distance from the color filter layer.

In another aspect, the display apparatus further includes a plurality of transistors, wherein each of the plurality of transistors form an active region inside the substrate.

In another aspect, the color filter layer includes a first color filter and a second color filter corresponding to a first subset of the plurality of sub-pixels, and an air layer corresponding to a second subset of the plurality of sub-pixels.

In another aspect, the air layer has a different refractive index than the first color filter and the second color filter.

In another aspect, the different colors include red, green, and blue colors, each of the plurality of sub-pixels correspond to one of the red, green, and blue colors, the first subset of the plurality of sub-pixels includes sub-pixels correspond to two of the red, green, and blue colors, and the second subset of the plurality of sub-pixels includes sub-pixels correspond to a remaining one of the red, green, and blue colors.

In another aspect, the light emitting element includes a plurality of first electrodes, each of the plurality of first electrodes corresponding to one of the plurality of sub-pixels, a light emitting layer formed over an entire surface of the substrate to cover the plurality of first electrodes, and a second electrode formed over the light emitting layer.

In another aspect, the plurality of reflective electrodes include at least two first reflective electrode corresponding to a first subset of the plurality of sub-pixels, and a second reflective electrode corresponding to a second subset of the plurality of sub-pixels.

In another aspect, an optical distance between the first reflective electrode and the second electrode is adjusted to cause constructive interference for light reflected between the first reflective electrode and the second electrode within a wavelength band of a color to be emitted from the second subset of the plurality of sub-pixels.

In another aspect, the color filter layer does not include a color filter over at least a subset of the plurality of sub-pixels.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 5 is a cross-sectional view specifically illustrating a structure of an organic electroluminescent display apparatus according to according to some aspects of the present disclosure;

DETAILED DESCRIPTION

Figure 1:
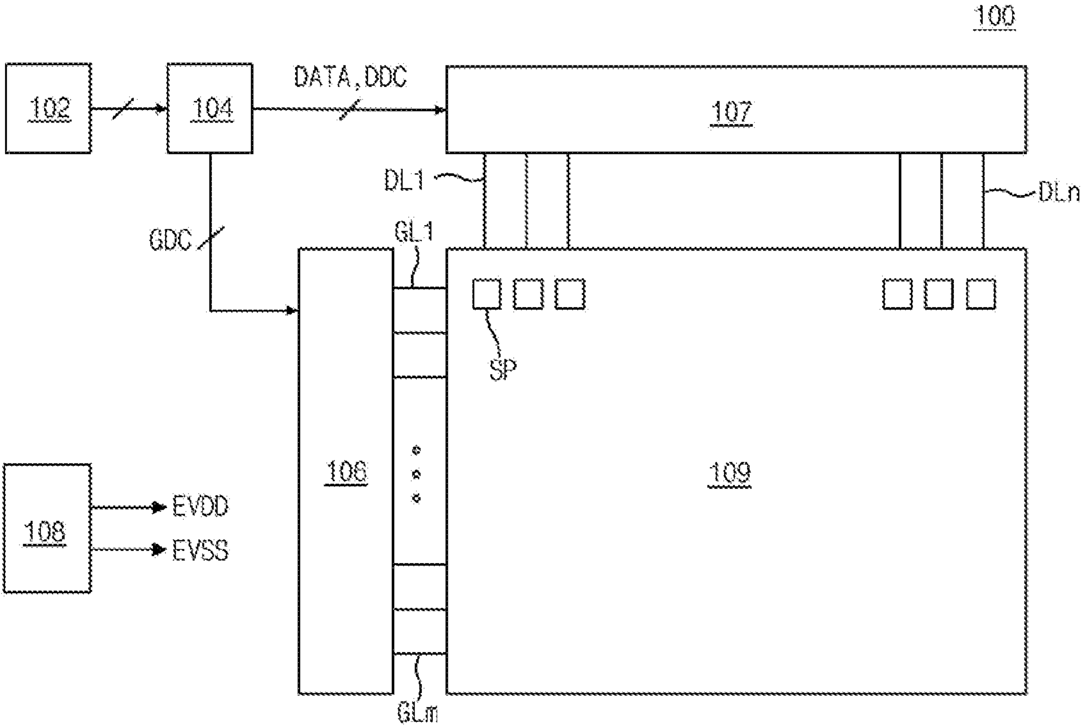
FIG. 1 is a schematic block diagram illustrating an organic electroluminescent display apparatus according to some aspects of the present disclosure.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description. Furthermore, in describing the present disclosure, if it is determined that a detailed description of the related known technology unnecessarily obscure the subject matter of the present disclosure, the detailed description thereof can be omitted. When 'including', 'having', 'consisting', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'below', 'beside', and the like, one or more other parts may be positioned between two parts unless 'right' or 'directly' is used.

In the case of a description of a temporal relationship, for example, when a temporal precedence is described as 'after', 'following', 'after', 'before', and the like, cases that are not continuous may be included unless 'directly' or 'directly' is used.

Although a first, a second and the like are used to describe various components, these components are not limited by these terms. These terms are only used to distinguish one component from another component. Therefore, a first component mentioned below may be a second component within the technical spirit of the present disclosure.

Respective features of various embodiments of the present disclosure can be partially or wholly connected to or combined with each other and can be technically interlocked and driven variously, and respective embodiments may be independently implemented from each other or may be implemented together with a related relationship.

Hereinafter, the present disclosure is explained with reference to the drawings.

Figure 2:
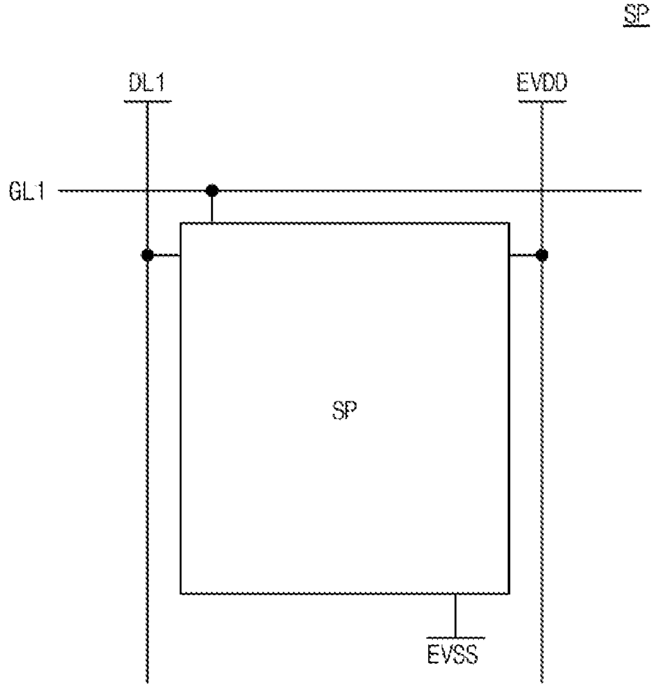
FIG. 2 is a schematic block diagram illustrating a sub-pixel of FIG. 1 according to some aspects of the present disclosure.

FIG. 1 is a schematic block diagram illustrating an organic electroluminescent display apparatus according to some aspects of the present disclosure. FIG. 2 is a schematic block diagram illustrating a sub-pixel of FIG. 1 according to some aspects of the present disclosure.

Referring to FIG. 1, the organic electroluminescent display apparatus 100 may include an image processing portion 102, a timing control portion 104, a gate driving portion 106, a data driving portion 107, a power supply portion 108 and a display panel 109.

The image processing portion 102 may output driving signals for driving various devices together with externally supplied image data. For example, the driving signals output from the image processing portion 102 may include a data enable signal, a vertical synchronization signal, a horizontal synchronization signal, a clock signal and the like.

The timing control portion 104 may receive driving signals and the like along with image data from the image processing portion 102. The timing control portion 104 may generate and output a gate timing control signal GDC for controlling an operation timing of the gate driving portion 106 and a data timing control signal DDC for controlling an operation timing of the data driving portion 107 based on the driving signals input from the image processing portion 102.

The gate driving portion 106 may output scan signals to the display panel 109 in response to the gate timing control signal GDC supplied from the timing control portion 104. The gate driving portion 106 may output the scan signals through a plurality of gate lines GL1 to GLm. In this case, the gate driving portion 106 may be formed in a form of an Integrated Circuit (IC), but is not limited thereto.

The data driving portion 107 may output data voltages to the display panel 109 in response to the data timing control signal DDC input from the timing control portion 104. The data driving portion 107 may sample and latch digital data signals DATA supplied from the timing control portion 104 to convert it into analog data voltages based on gamma voltages. The data driving portion 107 may output the data voltages through a plurality of data lines DL1 to DLn. In this case, the data driving portion 107 may be formed in a form of an IC, but is not limited thereto.

The power supply portion 108 may output a high potential voltage VDD, a low potential voltage VSS and the like and supply them to the display panel 109. The high potential voltage VDD may be supplied to the display panel 109 through a first power line EVDD, and the low potential voltage VSS may be supplied to the display panel 109 through a second power line EVSS. In this case, the voltage output from the power supply portion 108 may be output to the gate driving portion 106 or the data driving portion 107 to be used for driving them.

The display panel 109 may display an image corresponding to the data voltage and the scan signal supplied from the data driver 107 and the gate driver 106 and the power supplied from the power supply portion 108.

The display panel 109 may be configured with a plurality of sub-pixels SP to display an actual image. The sub-pixels SP may include a red (R) sub-pixel, a green (G) sub-pixel, and a blue (B) sub-pixel, or may include a white (W) sub-pixel, a red (R) sub-pixel, a green (G) sub-pixel and a blue (B) sub-pixel. In this case, the W, R, G, and B sub-pixels SP may all have the same area, but may have different areas.

Referring to FIG. 2, one sub-pixel SP may be connected to a gate line GL1, a data line DL1, a first power line EVDD, and a second power line EVSS. Numbers of transistors and capacitors of the sub-pixel SP as well as a driving method of the sub-pixel SP may be determined according to a configuration of a pixel circuit thereof.

Figure 3:
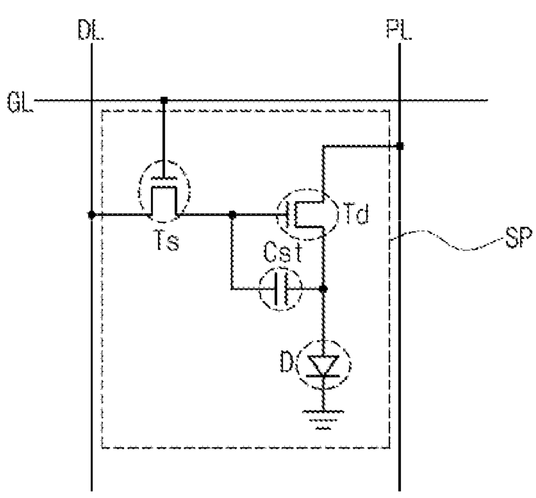
FIG. 3 is a circuit diagram conceptually illustrating a sub-pixel of an organic electroluminescent display apparatus according to some aspects of the present disclosure.

FIG. 3 is a circuit diagram conceptually illustrating a sub-pixel of an organic electroluminescent display apparatus according to according to some aspects of the present disclosure.

Referring to FIG. 3, the organic electroluminescent display apparatus of the present disclosure may include a gate line GL, a data line DL, and a power line PL that cross each other and define the sub-pixel SP. In the sub-pixel SP, a switching transistor Ts, a driving transistor Td, a storage capacitor Cst, and an organic light emitting element D may be disposed.

The switching transistor Ts may be connected to the gate line GL and the data line DL, and the driving transistor Td and the storage capacitor Cst may be connected between the switching transistor Ts and the power line PL, and the organic light emitting element D may be connected to the driving transistor Td.

In the organic electroluminescent display apparatus having such the structure, when the switching transistor Ts is turned on according to the gate signal applied to the gate line GL, the data signal applied to the data line DL is applied to a gate electrode of the driving transistor Td and one electrode of the storage capacitor Cst through the switching transistor Ts.

The driving transistor Td is turned on according to the data signal applied to the gate electrode, and as a result, a current proportional to the data signal flows from the power line PL to the organic light emitting element D through the driving transistor Td. The organic light emitting element D emits a light with a luminance proportional to the current flowing through the driving transistor Td.

At this time, the storage capacitor Cst is charged with a voltage proportional to the data signal so that the voltage of the gate electrode of the driving transistor Td is constantly maintained for one frame.

Although only two transistors Td and Ts and one capacitor Cst are provided in the drawing, the present disclosure is not limited thereto, and three or more transistors and two or more capacitors may be provided.

Figure 4:
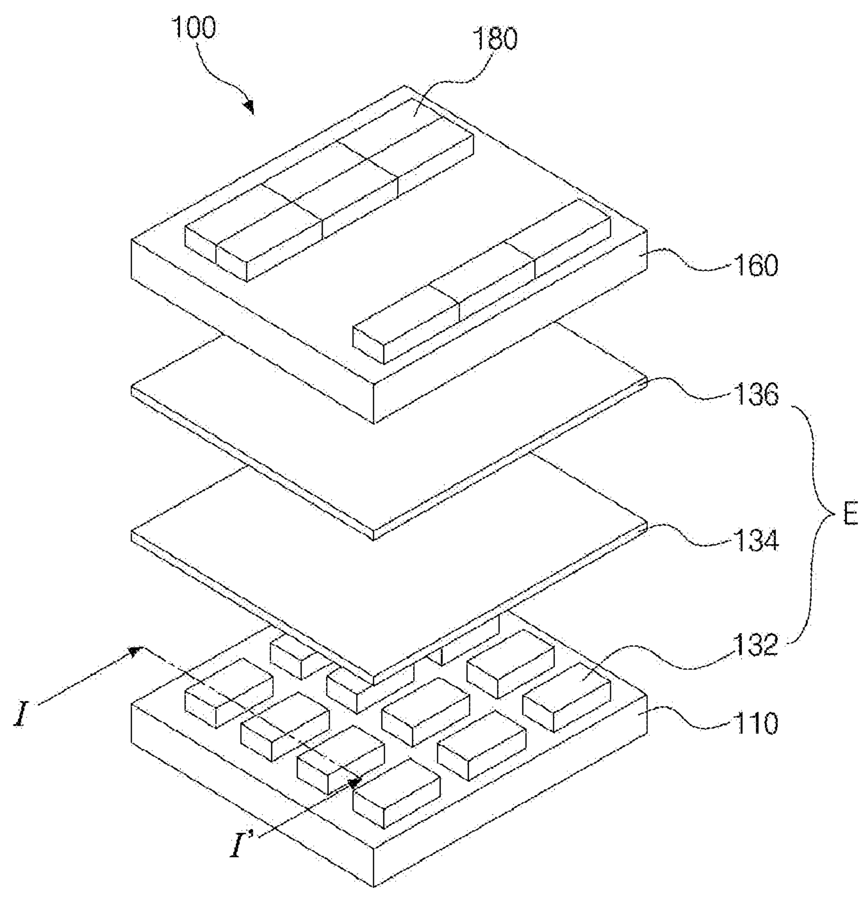
FIG. 4 is a perspective view schematically illustrating a structure of an organic electroluminescent display apparatus according to according to some aspects of the present disclosure.

FIG. 4 is a perspective view schematically illustrating a structure of an organic electroluminescent display apparatus according to some aspects of the present disclosure.

The organic electroluminescent display apparatus 100 according to the present disclosure can be applied to various structures. Hereinafter, a so-called Organic Light Emitting Diode on Silicon (OLEDoS) structure in which an organic light emitting element is formed on a silicon wafer substrate using a semiconductor process may be explained. However, the present disclosure is not limited to the organic electroluminescent display apparatus 100 having such structure.

Referring to FIG. 4, the organic electroluminescent display apparatus 100 may include a wafer substrate 110, a first electrode 132, an organic light emitting layer 134, a second electrode 136, an encapsulation layer 160 and a color filter layer 180.

The wafer substrate 110 may be a silicon wafer substrate formed using a semiconductor process. An active layer may be formed inside the wafer substrate 110, and a gate line, a data line and a transistor may be disposed on a top surface of the wafer substrate 110.

The first electrode 132, the organic light emitting layer 134, and the second electrode 136 may be sequentially formed to form the organic light emitting element E. The first electrode 132 of a plurality of red (R) sub-pixels, green (G) sub-pixels and blue (B) sub-pixels may be arranged on the wafer substrate 110 to be spaced apart from each other at a predetermined interval.

The organic light emitting layer 134 may be formed entirely over the wafer substrate 110 to cover the wafer substrate 110 and the first electrode 132. The organic light emitting layer 134 may be formed in common over all R, G, and B sub-pixels to emit white lights from these sub-pixels.

The second electrode 136 may be formed on the organic light emitting layer 134. The second electrode 136 may be formed over the entire sub-pixels to apply a signal to all sub-pixels at the same time.

The encapsulation layer 160 may be formed on the second electrode 136 to prevent oxygen or moisture from penetrating into the organic light emitting element E. The encapsulation layer 160 may be configured with multiple layers using an inorganic layer and an organic layer.

The color filter layer 180 may be formed on the encapsulation layer 160.

The color filter layer 180 (or partial color filter layer) may be formed with color filter layers having two colors. For example, the color filter layer 180 may include red (R) and green (G) color filter layers, may include green (G) and blue (B) color filter layers, or may include R and B color filter layers. That is, in the organic electroluminescent display apparatus 100 according to the present disclosure, color filter layers are not provided in all of the R, G, and B sub-pixels, but only the color filter layers are provided in two (or a first subset) of the R, G, and B sub-pixels and an empty space i.e., an air layer instead of a color filter layer exists in the remaining sub-pixel (or a second subset).

In the organic electroluminescent display apparatus 100 of the OLEDoS structure, because the active layer is formed on the wafer substrate 110 to form a transistor, a single crystal transistor of an excellent electrical mobility can be formed. Accordingly, a size of the sub-pixel can be significantly reduced, thereby manufacturing a high-resolution display apparatus.

In addition, in the organic electroluminescent display apparatus 100 of the OLEDoS structure, not only transistors in the sub-pixels but also transistors of the gate driving portion and the data driving portion can be formed of single crystal transistors, and thus a fast response speed can be obtained.

In addition, in the organic electroluminescent display apparatus 100 according to the present disclosure, color filter layers are formed in only two sub-pixels among the R, G, and B sub-pixels and an air layer is formed in the remaining sub-pixel, and thus a light efficiency of a wavelength band corresponding to the color filter layers can be greatly improved. This is described in detail later.

The organic electroluminescent display apparatus 100 of such the OLEDoS structure may be applied to various fields. For example, the organic electroluminescent display apparatus 100 of the OLEDoS structure may be applied to a metaverse device that represents a virtual world based on virtual reality (VR) and augmented reality (AR) which have been in the spotlight recently.

Figure 5:
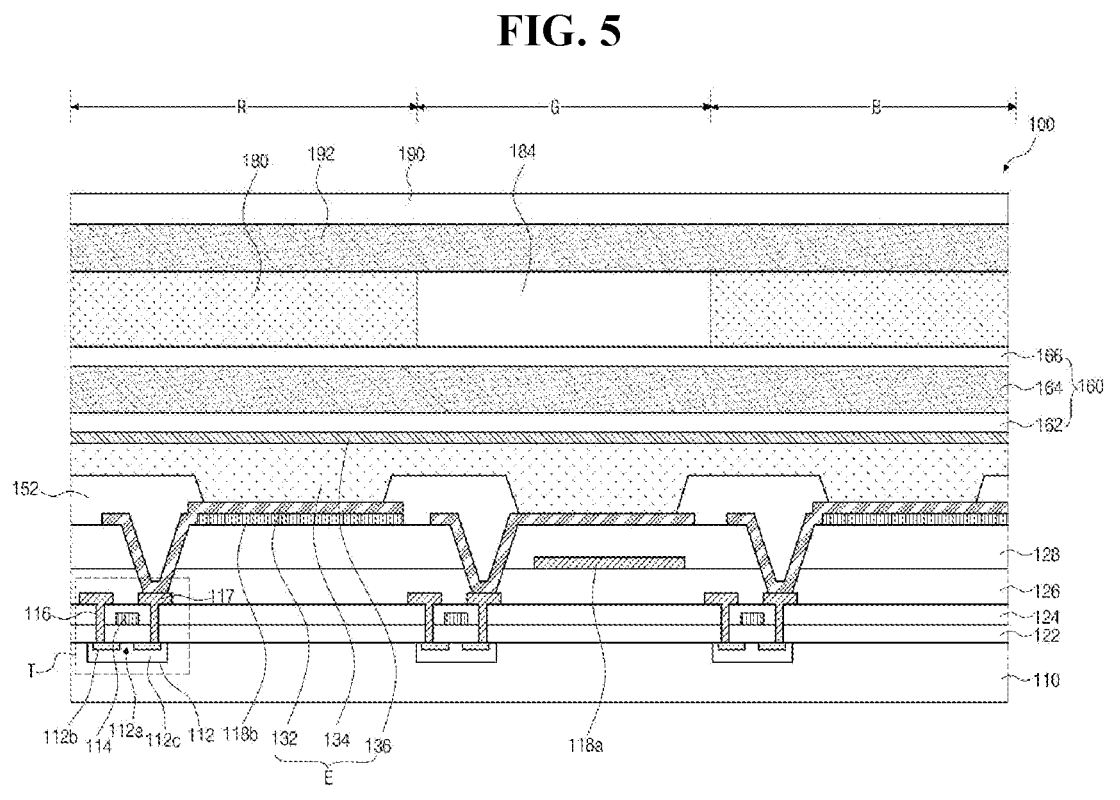

FIG. 5 is a cross-sectional view taken along a line I-I' of FIG. 4, which illustrates a specific structure of an organic electroluminescent display apparatus according to some aspects of the present disclosure.

In the organic electroluminescent display apparatus 100, color filter layers are formed on only two sub-pixels among R, G, and B sub-pixels and an air layer is formed on the remaining sub-pixel. Hereinafter, a structure in which color filter layers are formed in the R and B sub-pixels and a color filter layer is not formed in the G sub-pixel is described as an example.

However, the present disclosure is not limited to such the structure, but may be applied to a structure in which color filter layers are formed in the G and B sub-pixels and a color filter layer is not formed in the R sub-pixel, and/or a structure in which color filter layers are formed in the R and G sub-pixels and a color filter layer is not formed in the B sub-pixel.

In addition, because a structure of the B sub-pixel is the same as that of the R sub-pixel, only the R sub-pixel and the G sub-pixel adjacent to each other are described below for convenience of description.

Referring to FIG. 5, in the organic electroluminescent display apparatus 100, a transistor T may be disposed on the wafer substrate 110 of each of the sub-pixels R, G and B.

The transistor T may include an active region 112 disposed inside the wafer substrate 110, a gate insulating layer 122 formed on a top surface of the wafer substrate 110, a gate electrode 114 disposed on the gate insulating layer 122, a first inter-layered insulating layer 124 formed on the gate insulating layer 122 on which the gate electrode 114 is disposed, and a source electrode 116 and a drain electrode 117 disposed on the first inter-layered insulating layer 124.

The wafer substrate 110 may be a single crystal silicon wafer formed by growing single crystal silicon (Si), but is not limited thereto, and may be a wafer made of various semiconductor materials.

The active region 112 may be formed in the wafer substrate 110. A portion of the active region 112 of the wafer substrate 110 may be doped with impurities inside the wafer substrate 110, and thus the active region 112 may be configured with a central channel region **112*a* undoped with impurities, and a source region 112*b* and a drain region 112*c* doped with impurities at both sides of the channel region 112*a***.

The gate insulating layer 122 may be formed of a single layer such as SiOx or SiNx or a plurality of layers using the materials, but is not limited thereto.

The gate electrode 114 may be formed of a single layer made of a metal such as Cr, Mo, Ta, Cu, Ti, Al, or an Al alloy or a plurality of layers using the metals, but is not limited thereto.

The first inter-layered insulating layer 124 may be formed of a single layer made of an inorganic material such as SiNx or SiOx or a plurality of layers using the material, or may be formed of an organic material such as photoacrylic. In addition, the first inter-layered insulating layer 124 may be configured with a plurality of layers of an organic material layer and an inorganic material layer.

The source electrode 116 and the drain electrode 117 may be formed of a single layer made of a metal such as Cr, Mo, Ta, Cu, Ti, Al, or an Al alloy or a plurality of layers using the metals, but is not limited to these materials.

The source electrode 116 and the drain electrode 117 may respectively be in ohmic contact with the source region **112*b* and the drain region 112*c* of the active region 112 through contact holes formed in the gate insulating layer 122 and the first inter-layered insulating layer 124**.

A passivation layer 126 and a second inter-layered insulating layer 128 may be formed on the wafer substrate 110 on which the transistor T is disposed. The passivation layer 126 may be formed of an organic material such as photoacrylic or formed of a plurality of layers of an organic layer made of an organic material and an inorganic layer made of an inorganic material, but is not limited thereto.

The second inter-layered insulating layer 128 may be formed of a single layer made of an inorganic material such as SiNx or SiOx or a plurality of layers using the materials but is not limited thereto and may use various materials.

A first reflective electrode 118*a* may be formed on the passivation layer 126 of, for example, the G sub-pixel corresponding to the second subset of the plurality of sub-pixels. The first reflective electrode 118*a* may be formed of a metal having a good reflectance, such as Ag or Al, but is not limited thereto. At this time, the first reflective electrode 118*a* may be floated so that no signal is applied thereto.

A second reflective electrode 118*b* may be formed on the second interlayer insulating layer 128 of, for example, the R sub-pixel (and the B sub-pixel) corresponding to the first subset of the plurality of sub-pixels. The second reflective electrode 118*b* may be formed of a metal having a good reflectance, such as Ag or Al, but is not limited thereto.

A bank layer 152 may be formed at a boundary of each sub-pixel on the second inter-layered insulating layer 128. The bank layer 152 may be a type of barrier defining the sub-pixel. The bank layer 152 may partition each sub-pixel to prevent lights of specific colors output from adjacent sub-pixels from being mixed and output.

The organic light emitting element E may be formed on the second inter-layered insulating layer 128, and may be connected to the drain electrode 117 of the transistor T through a contact hole formed in the second inter-layered insulating layer 128 and the passivation layer 126.

The organic light emitting element E may include a first electrode 132 formed between the bank layers 152 and connected to the drain electrode 117 of the transistor T through the contact hole, an organic light emitting layer 134 formed on the first electrode 132 and the bank layer 152, and a second electrode 136 formed on the organic light emitting layer 134.

The first electrode 132 may be made of a transparent conductive material, such as indium tin oxide (ITO) or indium zinc oxide (IZO), or a thin metal through which visible light can pass, but is not limited thereto. The first electrode 132 may be connected to the drain electrode 117 of the transistor T and may be applied with an image signal from the outside.

The first electrode 132 may be formed for each sub-pixel, and the first electrode 132 of the sub-pixel may be applied with a corresponding image signal.

The organic light emitting layer 134 may be formed on the first electrode 132 and the bank layer 152. The organic light emitting layer 134 may include at least one of a hole transporting layer, a hole injecting layer, a light emitting layer, an electron transporting layer, and an electron injecting layer.

The organic light emitting layer 134 may be a white organic light emitting layer emitting a white light and formed over the entire display apparatus 100. The organic light emitting layer 134 may be formed with two or more stacks in a tandem structure. Each of the stacks may include a hole transporting layer, a light emitting layer, and an electron transporting layer.

The light emitting layer may have a plurality of light emitting layers stacked in a tandem structure. For example, in the light emitting layer, a red (R) light emitting layer, a green (G) light emitting layer and a blue (B) light emitting layer are stacked in a tandem structure, and red light, green light and blue light output from these light emitting layers are mixed to output a white light. In this case, a hole transporting layer, an electron transporting layer and a charge generation layer may be disposed between the plurality of light emitting layers.

In addition, the light emitting layer may include a yellow-green light emitting layer and a blue (B) light emitting layer stacked in a tandem structure so that a yellow-green light and a blue light emitted from the light emitting layers are mixed to output a white light.

In the organic electroluminescent display apparatus 100, the structure of the light emitting layer to output a white light is not limited to the above structure, but various structures may be used. The organic light emitting layer 134 may be formed over the entire wafer substrate 110 by a deposition process or a solution process.

The second electrode 136 may be formed of a single layer made of a metal such as Ca, Ba, Mg, Al, Ag, or an alloy thereof or a plurality of layers using the metals but is not limited thereto.

In the organic light emitting element E having such structure, when voltages are applied to the first electrode 132 and the second electrode 136, holes and electrons move to the light emitting layer through the hole transporting layer and the electron transporting layer, respectively, and are coupled to each other in the light emitting layer to emit a light.

An encapsulation layer 160 may be formed on the second electrode 136. The encapsulation layer 160 may include a first encapsulation layer 162 made of an inorganic material, a second encapsulation layer 164 made of an organic material, and a third encapsulation layer 166 made of an inorganic material. In this case, the inorganic material may include, but is not limited to, SiNx and SiOx. In addition, the organic material may include, but is not limited to, polyethylene terephthalate, polyethylene naphthalate, polycarbonate, polyimide, polyethylene sulfonate, polyoxymethylene, polyarylate, or mixtures thereof.

A color filter layer 180 may be formed on the encapsulation layer 160. The color filter layer 180 may include an R color filter and a B color filter respectively formed in the R sub-pixel and the B sub-pixel. In this case, in the G sub-pixel, the color filter layer 180 is not formed but an empty space is formed. Strictly speaking, the color filter layer 180 may mean the R color filter and the B color filter, but the empty space of the G sub-pixel i.e., the air layer 184 filled with air may also be regarded as a part of the color filter layer 180. In the organic electroluminescent display apparatus 100, a plurality of reflective electrodes may be included, wherein at least one of the plurality of reflective electrodes may be at a first distance from the color filter layer and remaining ones of the plurality of reflective electrodes may be at a second distance from the color filter layer. The plurality of reflective electrodes may comprise at least two first reflective electrode corresponding to a first subset of the plurality of sub-pixels; and a second reflective electrode corresponding to a second subset of the plurality of sub-pixels. The color filter layer may not include a color filter over at least a subset of the plurality of sub-pixels.

The R color filter absorbs alight of a wavelength band other than a red light while a white light emitted from the organic light emitting element E and input to the R color filter passes through the R color filter, thereby outputting only a red light. The B color filter absorbs a light of a wavelength band other than a blue light while a white light emitted from the organic light emitting element E and input to the B color filter passes through the B color filter, thereby outputting only a blue light.

An adhesive 192 may be disposed on the color filter layer 180 and a protection member 190 may be disposed on the adhesive 192, and thus the protection member 190 may be attached by the adhesive 192.

The protection member 190 may protect and encapsulate the organic electroluminescent display apparatus 100, and may be formed of glass or a transparent film. As such the film, a transparent protection film such as a polystyrene (PS) film, a polyethylene (PE) film, a polyethylene naphthalate (PEN) film, or a polyimide (PI) film may be used.

The adhesive 192 may use a transparent optical adhesive (OCA). The OCA may be formed in a form of a double-sided tape, release films may be attached to both sides, and when the release films are peeled off during bonding, bonding objects may be bonded by attaching the bonding objects to both sides of the OCA. Because the OCA is disposed between the color filter layer 180 and the protection member 190 in a semi-solid state, an adhesive material does not flow into the air layer 184, and the air layer 184 of the color filter layer 180 can maintain the same shape as the R color filter and the B color filter.

However, in the organic electroluminescent display apparatus 100, the adhesive 192 is not limited to OCA, and various adhesive members may be used.

As described above, in the organic electroluminescent display apparatus 100, because the transistor T is formed on the wafer substrate 110 made of a single crystal semiconductor rather than a glass or plastic film, even when an area of the sub-pixel is significantly reduced, a desired high-quality image can be expressed, thereby enabling realization of the high-resolution display apparatus 100.

Furthermore, in the organic electroluminescent display apparatus 100, because a black matrix for preventing light leakage is not formed between the sub-pixels R and G, finer sub-pixels can be formed, thereby enabling realization of the super high-resolution display apparatus 100.

In the organic electroluminescent display apparatus 100, by forming only the R and B color filters as the color filter layer 180 and removing the G color filter to form the air layer 184, the light efficiency of the R, G and B sub-pixels can be improved. Hereinafter, this is described in detail.

Figure 6:
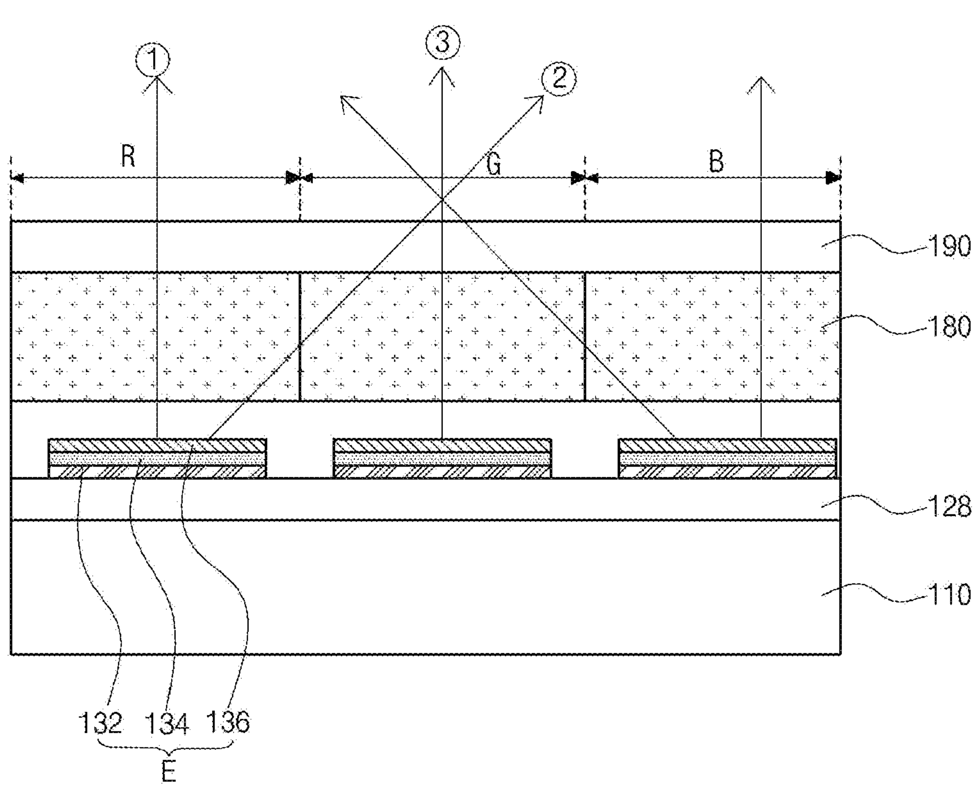
FIG. 6 is a view illustrating an output path of alight emitted from an organic light emitting element in an organic electroluminescent display apparatus including a G color filter according to some aspects of the present disclosure.

FIG. 6 is a view illustrating an output path of alight emitted from an organic light emitting element in an organic electroluminescent display apparatus including a G color filter according to some aspects of the present disclosure.

Referring to FIG. 6, when the color filter layer 180 includes R, G, and B color filters, white lights emitted from the sub-pixels R, G, and B are output through the color filter layer 180. At this time, the white light passing through the R color filter is absorbed in other wavelength band and outputs only a red light, the white light passing through the G color filter is absorbed in other wavelength band and outputs only a green light, and the white light passing through the B color filter is absorbed in other wavelength band and outputs only a blue light.

However, in the case of the organic electroluminescent display apparatus of such structure, because a black matrix is not disposed between the R, G, and B color filters, a light passing through a specific sub-pixel may be output through other adjacent sub-pixel regions.

For example, lights ① and ③ that pass through the R color filter and the G color filter vertically are output to the R sub-pixel and the G sub-pixel as they are.

The color filter layer 180 includes R, G, and B color filters having similar refractive indices, and because the R, G, and B color filters are in contact with each other at interfaces of the sub-pixels, the interfaces of the sub-pixels have substantially similar refractive indices. Accordingly, a light incident to a specific sub-pixel at a predetermined angle and incident on an interface with the adjacent sub-pixel is output through the adjacent sub-pixel as it is without refraction.

For example, a light ② input to the R color filter at a certain angle is incident on the interface between the R sub-pixel and the G sub-pixel, and the incident light is directly input to the G sub-pixel without refraction or reflection. Accordingly, not all of the light output from the R sub-pixel is output from the R sub-pixel, but some light is output from the adjacent G sub-pixel. Thus, mixture of different colors of a red light and a green light is generated in the G sub-pixel so that a spot is generated on the screen due to light leakage.

Figure 7:
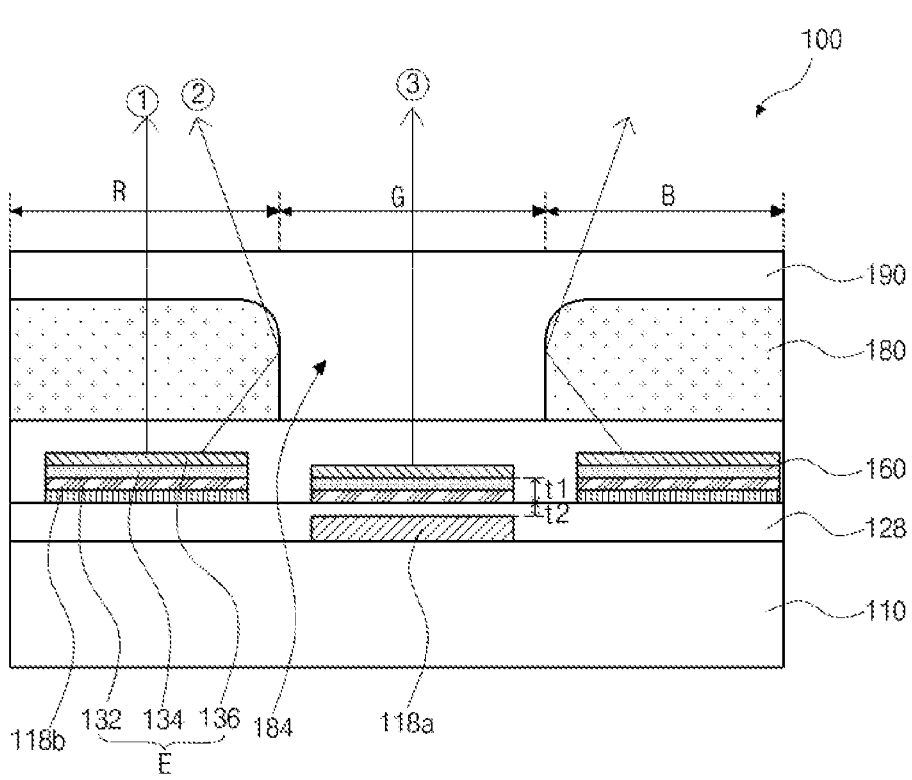
FIG. 7 is a view illustrating an output path of alight emitted from an organic light emitting element in an organic electroluminescent display apparatus according to some aspects of the present disclosure.

FIG. 7 is a view illustrating an output path of alight emitted from an organic light emitting element in an organic electroluminescent display apparatus according to some aspects of the present disclosure (i.e., an organic electroluminescent display apparatus not including a G color filter).

Referring to FIG. 7, in the organic electroluminescent display apparatus 100, the color filter layer 180 is formed in the R and B sub-pixels, but the color filter layer 180 is not formed in the G sub-pixel. In the region corresponding to the color filter layer of the sub-pixel G, the color filter layer 180 is deleted and the air layer 184 is formed instead.

In addition, the second inter-layered insulating layer 128 may be formed below the organic light emitting element E, and the first reflective electrode **118*a* may be disposed below the second inter-layered insulating layer 128 of the G sub-pixel. The second reflective electrodes 118*b*** may be disposed below the organic light emitting elements E of the R and B sub-pixels.

In the organic electroluminescent display apparatus 100 of such structure, white lights emitted from the organic light emitting elements E of the R and B sub-pixels are transmitted through the color filter layer 180 thereon and are output. For example, a white light emitted from the organic light-emitting element E of the R sub-pixel is absorbed in other wavelength band while passing through the R color filter so that only a red light is output, and a white light emitted from the organic light-emitting element E of the B sub-pixel is absorbed in other wavelength band while passing through the B color filter so that only a blue light is output.

At this time, a light emitted downward from the organic light emitting element E is reflected by the second reflective electrode **118*b* below the organic light emitting element E then passes through the color filter layer 180** again and then is output.

Lights 1 emitted from the organic light emitting elements E of the R and B sub-pixels and output vertically upward are output through the corresponding color filters.

Lights 2 emitted from the organic light emitting elements E of the R and B sub-pixels and output upward at a predetermined angle are incident on the interface with the G sub-pixel. However, because the color filter layer is not formed in the G sub-pixel and the air layer 184 is present, due to the difference in refractive index between the color filter layer 180 made of an organic material and the air layer 184, the lights incident to the interfaces with the G sub-pixel are not input to the G sub-pixel and are reflected at the interfaces. In other words, the lights incident to the interfaces with the sub-pixel G are output through their corresponding sub-pixels R and B by reflection.

Accordingly, in the organic electroluminescent display apparatus 100, because the lights emitted from the organic light emitting elements E of the R and B sub-pixels do not penetrate into the adjacent sub-pixel but are all output through the corresponding color filters, luminance in such the sub-pixels is greatly increased.

Figure 8A:
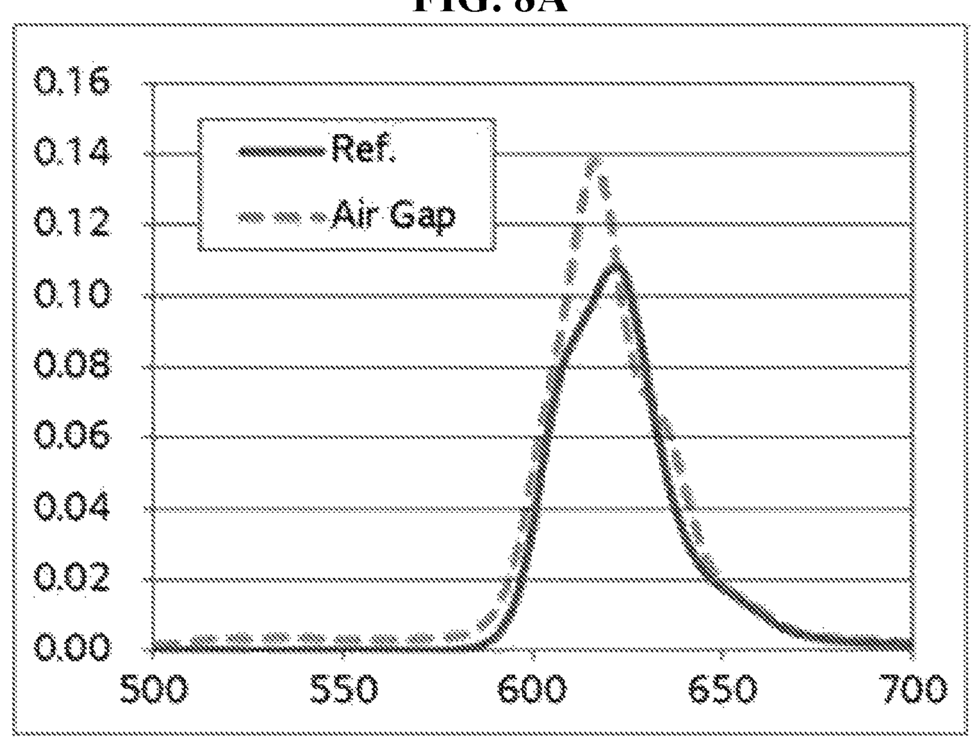
FIG. 8A is a view illustrating a luminance at a R sub-pixel in the case of including a G color filter and in the case of including an air layer without a G color filter according to some aspects of the present disclosure.
Figure 8B:
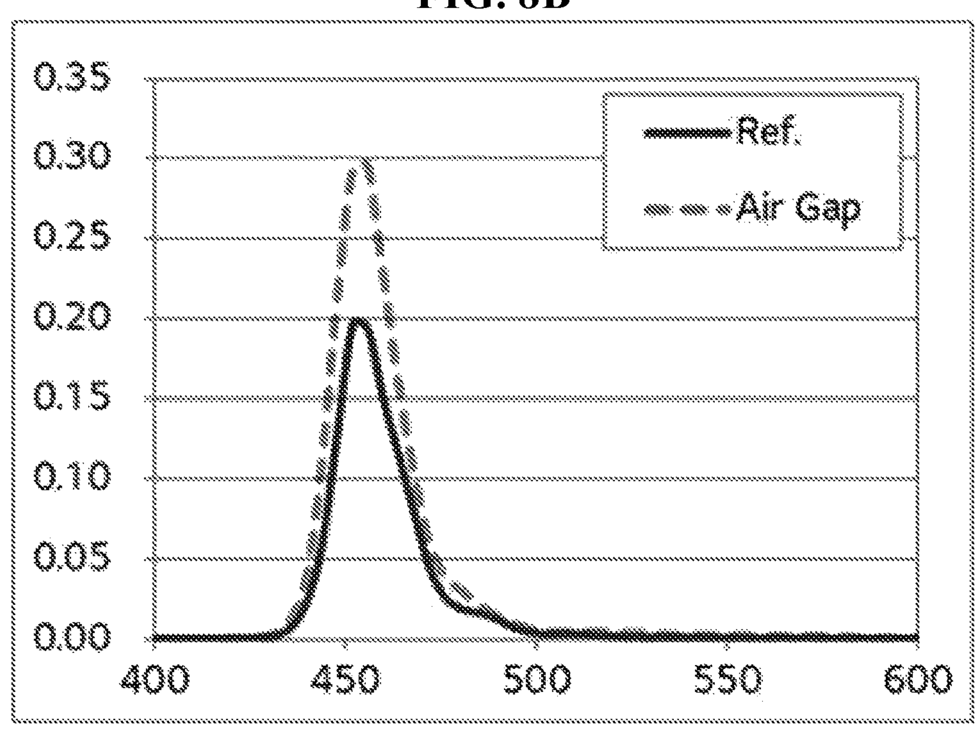
FIG. 8B is a view illustrating a luminance at a B sub-pixel in the case of including a G color filter and in the case of including an air layer without a G color filter according to some aspects of the present disclosure.

FIG. 8A is a view illustrating a luminance at a R sub-pixel in the case of including a G color filter and in an organic electroluminescent display apparatus including an air layer without a G color filter according to some aspects of the present disclosure, FIG. 8B is a view illustrating a luminance at a B sub-pixel in the case of including a G color filter and in an organic electroluminescent display apparatus including an air layer without a G color filter according to some aspects of the present disclosure. In this case, the solid line Ref is a luminance in the case of including the G color filter, and a dotted line (air gap) is a luminance of the organic electroluminescent display apparatus according to the first embodiment of the present disclosure.

Referring to FIG. 8A, when the G color filter is provided, the luminance of the red light output through the R sub-pixel is about 0.11, whereas when the air layer 184 is provided, the luminance of the red light output through the R sub-pixel is increased to about 0.14.

Referring to FIG. 8B, when the G color filter is provided, the luminance of blue light output through the B sub-pixel is about 0.20, whereas when the air layer 184 is provided, the luminance of the blue light output through the B sub-pixel is increased to about 0.30.

As described above, in the organic electroluminescent display apparatus 100, because the lights output from the organic light emitting elements E of the R and B sub-pixels and incident to the interfaces with the G sub-pixel are totally reflected and output again through the R and B sub-pixels, the luminance of the R and B sub-pixels is greatly improved.

On the other hand, some of the white light emitted from the organic light emitting element E of the G sub-pixel is directly output upward and passes through the air layer 184, and the remaining light is reflected by the first reflective electrode 118*a* and then output upward to pass through the air layer 184. In other words, a light emitted from the organic light emitting element E and directly passing through the air layer 184, and a light reflected by the first reflective electrode 118*a* and passing through the air layer 184 are output through the G sub-pixel.

In the organic electroluminescent display apparatus 100, the light directly output from the organic light emitting element E and the light output after being reflected from the first reflective electrode 118*a* constructively interfere with each other. In particular, by making a constructive interference between the light output directly from the organic light emitting element E and the light output after being reflected from the first reflective electrode 118*a* in a green wavelength band, only a green light is output through the G sub-pixel without a G color filter. At this time, there occurs a complete destructive interference or a destructive interference to a certain extent for a light of other wavelength band thus the light of other wavelength band is removed or is greatly reduced in intensity, so that the light output through the G sub-pixel becomes substantially a green light.

A constructive interference between the light directly output from the organic light emitting element E and the light output after being reflected from the first reflective electrode 118*a* is performed according to Equation 1 below.

$$2nd=m\lambda;\ \lambda=2nd/m. \qquad \text{[Equation 1]}$$

In the Equation 1, n is an integer, d is an optical distance, X is a wavelength, and m is an order.

The optical distance d is a distance from atop surface of the first reflective electrode 118*a* to a bottom surface of the second electrode 136. Accordingly, the optical distance d is a sum of a thickness t1 of the first electrode 132 and the organic light emitting layer 134 of the organic light-emitting element E, and a distance t2 from the top surface of the first reflective electrode 118*a* to a top surface of the second inter-layered insulating layer 128. At this time, because the distance t2 is a value obtained by subtracting a thickness of the first reflective electrode 118*a* from a thickness of the second inter-layered insulating layer 128, assuming that the thickness of the first reflective electrode 118*a* is fixed, the distance t2 can be adjusted by adjusting the thickness of the second interlayer insulating layer 128. In addition, assuming that the thickness of the second inter-layered insulating layer 128 is fixed, the distance t2 can be adjusted by adjusting the thickness of the first reflective electrode 118*a*. In addition, the distance t2 can be adjusted by adjusting the thickness of the second inter-layered insulating layer 128 and the thickness of the first reflective electrode 118*a*.

In the organic electroluminescent display apparatus 100, a constructive interference occurs at a wavelength of a green light, for example, about 528 nm (λ=528 nm), and the green light is output through the G sub-pixel. The output green light may be a light resulting from a constructive interference with a first, second, third, and higher orders. In order to a first-order constructive interference with light of a wavelength of about 528 nm, the optical distance d must be minimized, but due to a process limitation, the thickness t1 of the first electrode 132 and the organic light emitting layer 134 and the thickness of the second inter-layered insulating layer 128 (and/or the first reflective electrode 118*a*) corresponding to the optical distance d cannot be formed to be less than a set thickness, so that it is not possible to substantially output a light due to the first-order constructive interference. In addition, since a green light due to a fourth or higher-order constructive interference is very small in intensity, it is not possible to actually output a green light through the G sub-pixel.

In the organic electroluminescent display apparatus 100, the thickness t1 of the first electrode 132 and the organic light emitting layer 134 and the thickness of the second inter-layered insulating layer 128 (and/or the first reflective electrode 118*a*) are adjusted such that a light is subjected to second-order and third-order constructive interferences at a wavelength band of a green light e.g., a wavelength band of 528 nm, and thus the green light of a desired intensity is output through the G sub-pixel.

Table 1 illustrates examples of the thickness t1 of the first electrode 132 and the organic light emitting layer 134 and the distance t2 from the top surface of the first reflective electrode 118*a* to the top surface of the second inter-layered insulating layer 128 in the second-order and third-order constructive interferences. However, the thickness t1 of the first electrode 132 and the organic light emitting layer 134 and the distance t2 from the top surface of the first reflective electrode 118*a* to the top surface of the second inter-layered insulating layer 128 of the present disclosure are not limited to the exemplified values. In addition, because the organic electroluminescent display apparatus 100 according to the first embodiment of the present disclosure is to output a green light through the G sub-pixel without the color filter layer 180, the second-order and third-order constructive interferences may occur at various wavelength bands corresponding to the green light, and the thickness t1 of the first electrode 132 and the organic light emitting layer 134 and the distance t2 from the top surface of the first reflective electrode 118*a* to the top surface of the second inter-layered insulating layer 128 according to the wavelength band for the constructive interference may be set variously.

TABLE 1

| Wave- | 2nd-order constructive interference (m = 2) | | | 3rd-orderconstructive interference (m = 3) | | |
|---|---|---|---|---|---|---|
| length (nm) | d(nm) | t1(nm) | t2(nm) | d(nm) | t1(nm) | t2(nm) |
| 528 | 2640 | 2000 | 640 | 3960 | 3300 | 660 |
| | | 2200 | 440 | | 3500 | 460 |
| | | 2400 | 240 | | 3700 | 260 |

Referring to Table 1, a second-order constructive interference occurs at a wavelength band of 528 nm when the optical distance d is 2640 nm. At this time, the thickness t1 of the first electrode 132 and the organic light emitting layer 134 may be 2000 nm, and the distance t2 from the top surface of the first reflective electrode 118*a* to the top surface of the second inter-layered insulating layer 128 may be 640 nm. Alternatively, the thickness t1 of the first electrode 132 and the organic light emitting layer 134 may be 2200 nm, and the distance t2 from the top surface of the first reflective electrode 118*a* to the top surface of the second inter-layered insulating layer 128 may be 440 nm. Alternatively, the thickness t1 of the first electrode 132 and the organic light emitting layer 134 may be 2400 nm, and the distance t2 from the top surface of the first reflective electrode 118*a* to the top surface of the second inter-layered insulating layer 128 may be 240 nm.

A third-order constructive interference occurs at a wavelength band of 528 nm when the optical distance (d) is 3960 nm. At this time, the thickness t1 of the first electrode 132 and the organic light emitting layer 134 may be 3300 nm, and the distance t2 from the top surface of the first reflective electrode 118*a* to the top surface of the second inter-layered insulating layer 128 may be 660 nm. Alternatively, the thickness t1 of the first electrode 132 and the organic light emitting layer 134 may be 3500 nm, and the distance t2 from the top surface of the first reflective electrode 118*a* to the top surface of the second inter-layered insulating layer 128 may be 460 nm. Alternatively, the thickness t1 of the first electrode 132 and the organic light emitting layer 134 is 3700 nm, and the distance t2 from the top surface of the first reflective electrode 118*a* to the top surface of the second inter-layered insulating layer 128 may be 260 nm.

However, the thickness t1 of the first electrode 132 and the organic light emitting layer 134 and the distance t2 from the top surface of the first reflective electrode 118*a* to the top surface of the second inter-layered insulating layer 128 in the organic electroluminescent display apparatus 100 are not limited to the above values. The optical distance d may be changed according to the wavelength band subjected to the constructive interference, and accordingly, the thickness t1 of the first electrode 132 and the organic light emitting layer 134 and the distance t2 from the top surface of the first reflective electrode 118*a* to the top surface of the second inter-layered insulating layer 128 may also be changed.

In addition, if possible in process, the thickness t1 of the first electrode 132 and the organic light emitting layer 134 and the thickness of the second interlayer insulating layer 128 (and/or the first reflective electrode 118*a*) may be formed in various combinations to satisfy the optical distance d.

Figure 9A:
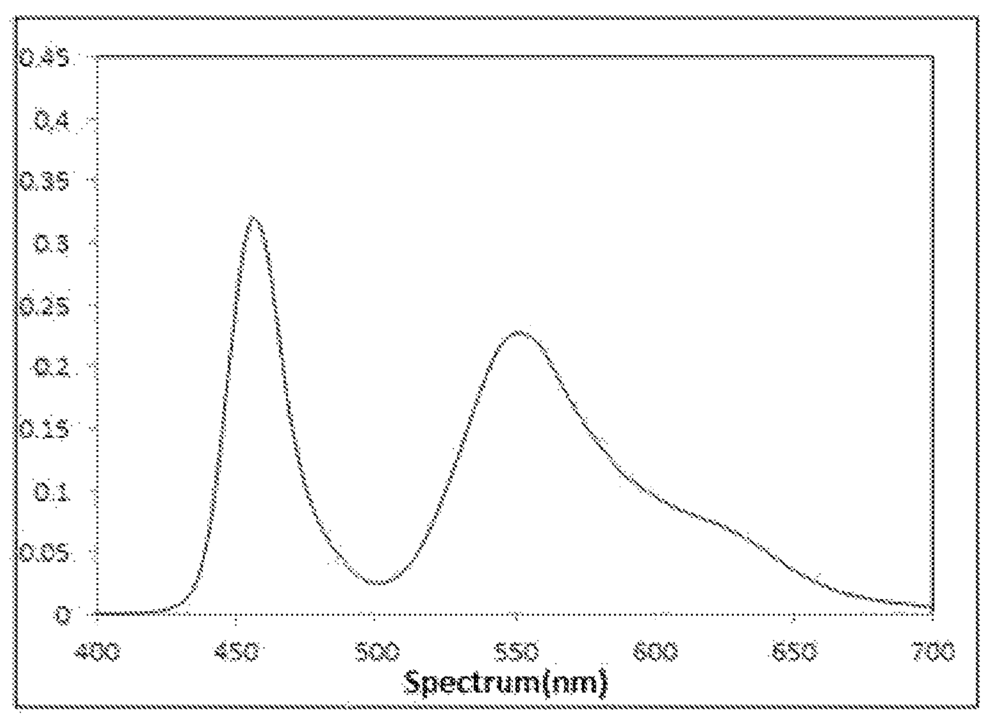
FIG. 9A illustrates a graph showing an optical spectrum when an optical distance is not adjusted in a G sub-pixel of an organic electroluminescent display device according to some aspects of the present disclosure.
Figure 9B:
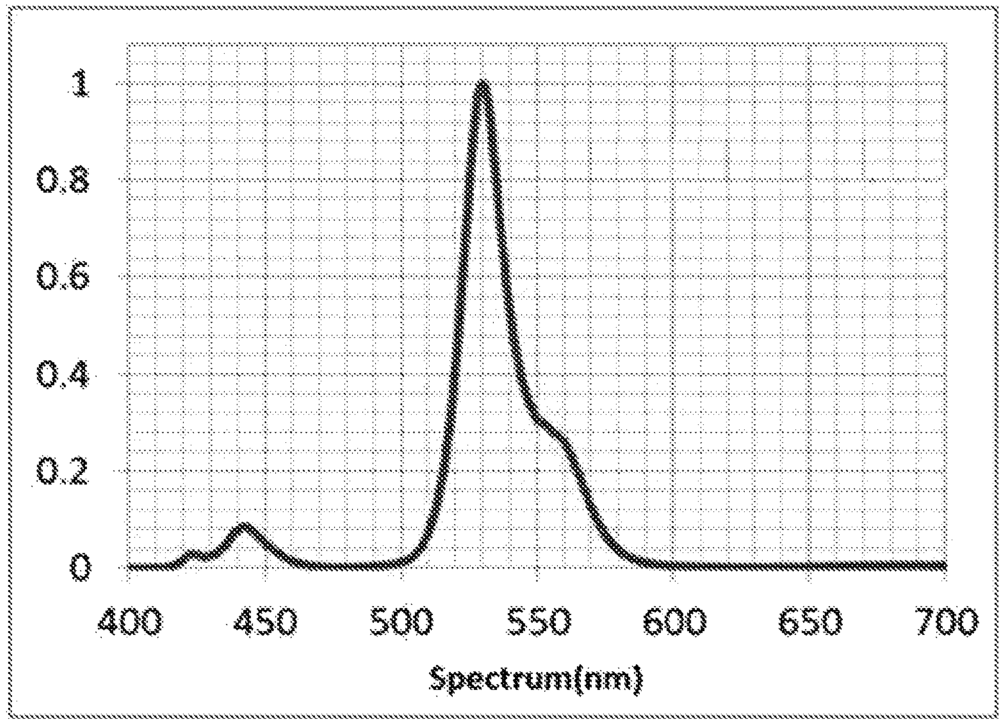
FIG. 9B illustrates a graph showing an optical spectrum when an optical distance is adjusted in a G sub-pixel of an organic electroluminescent display device according to some aspects of the present disclosure.

FIG. 9A illustrates a graph showing an optical spectrum when an optical distance is not adjusted (i.e., there is no constructive interference) in a G sub-pixel of an organic electroluminescent display device according to some aspects of the present disclosure. FIG. 9B illustrates a graph showing an optical spectrum when an optical distance is adjusted (i.e., there is a constructive interference) in a G sub-pixel of an organic electroluminescent display device according to some aspects of the present disclosure.

Referring to FIG. 9A, when the optical distance d is not adjusted, a light output from the G sub-pixel is a light having a low peak at about 460 nm and 570 nm i.e., a light close to a white light as a whole. On the other hand, referring to FIG. 9B, when the optical distance d is adjusted, a light output from the G sub-pixel is a green light having a peak at about 528 nm.

As described above, in the organic electroluminescent display apparatus 100, by adjusting the optical distance d, a green light of high purity can be output through the G sub-pixel without a G color filter.

As described above, in the organic electroluminescent display apparatus 100, because transistors are formed on a wafer and a black matrix is not formed between color filters, a high-performance display apparatus with high resolution can be realized.

In addition, in the organic electroluminescent display apparatus 100, by removing the G color filter and forming an air layer of a low refractive index at the position where the G color filter is removed, the light incident on the interface with the G sub-pixel is totally reflected. Accordingly, it is possible to prevent staining caused by the mixing of lights of different colors into the G sub-pixel.

In addition, in the organic electroluminescent display apparatus 100, lights incident on the interface with the G sub-pixel from the R and B sub-pixels are totally reflected and output back to the R and B sub-pixels. Accordingly, by increasing the intensity of the lights output to the R and B sub-pixels, a light efficiency can be significantly improved.

Meanwhile, in the organic electroluminescent display apparatus 100, the structure in which the color filter layers are formed in the R and B sub-pixels and the color filter layer is not formed in the G sub-pixel has been described as an example. However, the disclosure is not limited to such the structure, but may be applied to a structure in which a color filter layer is formed in the G and B sub-pixels and a color filter layer is not formed in the R sub-pixel, and a structure in which a color filter layer is formed in the R and G sub-pixels and a color filter layer is formed in the B sub-pixel.

Figure 10:
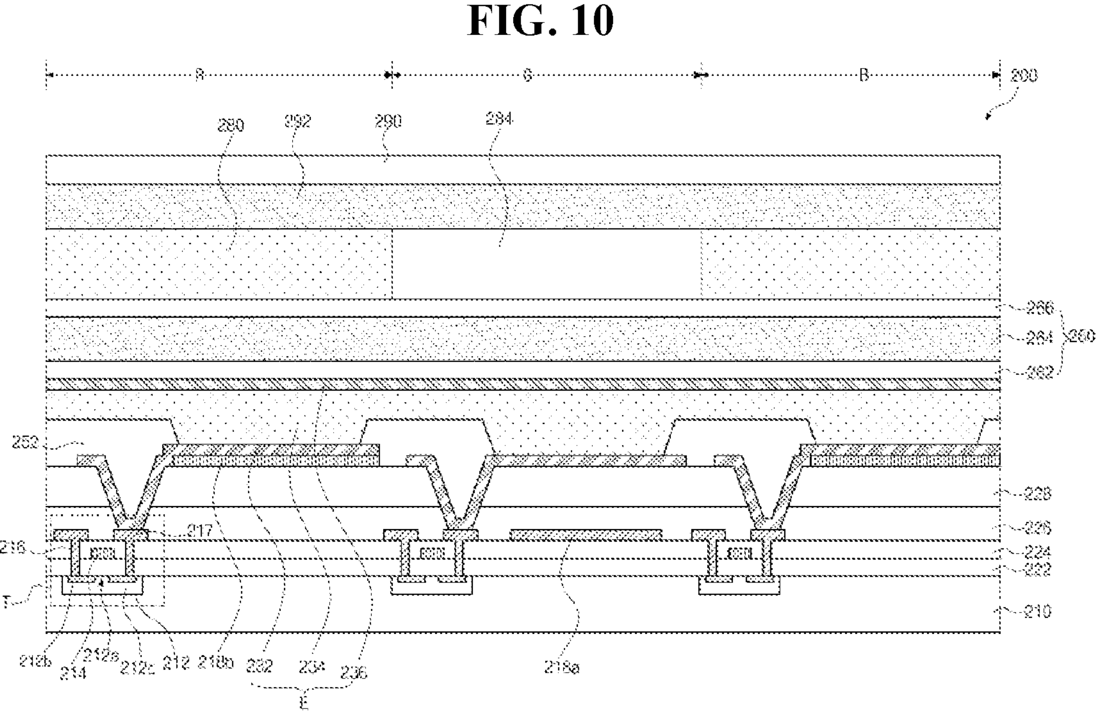
FIG. 10 is a cross-sectional view of an organic light emitting display device according to some aspects of the present disclosure.

FIG. 10 is a cross-sectional view of an organic electroluminescent display apparatus according to some aspects of the present disclosure. At this time, the same configuration as that of the first embodiment shown in FIG. 5 may be omitted or simplified, and only other configuration may be described in detail.

Referring to FIG. 10, in the organic electroluminescent display apparatus 200, transistors T and organic light emitting elements E may be formed on a wafer substrate 210 made of a single crystal semiconductor such as single crystal silicon.

A first reflective electrode 218*a* may be formed on a first inter-layered insulating layer 224 on the transistor T. In this case, the first reflective electrode 218*a* may be formed of the same metal as and in the same process as the source electrode 216 and the drain electrode 217 of the transistor T but is not limited thereto. Alternatively, the first reflective electrode 218*a* may be formed of a metal different from and in a process different from the source electrode 216 and the drain electrode 217.

The first reflective electrode 218*a* may be formed of a metal having a good reflectance, such as Al or Ag, but is not limited thereto.

The organic light emitting element E may include a first electrode 232 formed between bank layers 252 and connected to the drain electrode 217 of the transistor T through a contact hole, an organic light emitting layer 234 formed on the first electrode 232 and the bank layer 252, and a second electrode 236 formed on the organic light emitting layer 234.

A second reflective electrode 218*b* may be formed below the first electrode 232. The source electrode 216 and the drain electrode 217 may respectively be in ohmic contact with a source region 212*b* and a drain region 212*c* at both sides of a channel region 212*a* of an active region 212 through contact holes formed in a gate insulating layer 222 on which a gate electrode 214 is disposed and the first inter-layered insulating layer 224. An encapsulation layer 260 formed on the second electrode 236 may include a first encapsulation layer 262 made of an inorganic material, a second encapsulation layer 264 made of an organic material, and a third encapsulation layer 266 made of an inorganic material. A protection member 290 may be attached to the color filter layer 280 by an adhesive 292.

In example configuration of FIG. 10, because a color filter layer 280 is not formed in the G sub-pixel but an air layer 284 is formed in the G sub-pixel, lights incident to interfaces with the G sub-pixel from the R and B sub-pixels are totally reflected and output again to the R and B sub-pixels. Accordingly, it is possible to significantly improve efficiency of lights output to the R and B sub-pixels.

In addition, by adjusting an optical distance from a top surface of the first reflective electrode 218*a* to a bottom surface of the second electrode 236, the optical distance of a constructive interference at a green light wavelength band is adjusted, and thus a green light is output through the G sub-pixel in which the color filter layer does not exist. In this case, the optical distance may be adjusted by adjusting the thickness of the first electrode 232 and the organic light emitting layer 234 and the distance from the top surface of the first reflective electrode 218*a* to the top surface of the second inter-layered insulating layer 228 (i.e., the thickness of the second interlayer insulating layer 228 and the thickness of the passivation layer 226). Therefore, for the second-order and third-order constructive interferences, it is preferable that the passivation layer 226 is formed of an inorganic material such as SiOx or SiNx and has a thickness of several hundred nm.

In example configuration of FIG. 10, because the color filter layer 280 is not formed in the G sub-pixel but the air layer 284 is formed in the G sub-pixel, the lights incident to the interfaces with the G sub-pixel from the R and B sub-pixels are totally reflected and output again to the R, B sub-pixels. Accordingly, it is possible to significantly improve an efficiency of the lights output to the R and B sub-pixels.

In addition, by adjusting the thickness of the first electrode 232 and the organic light emitting layer 234 and the thickness of the second inter-layered insulating layer 228 and the passivation layer 226, the optical distance of a constructive interference at the green light wavelength band can be achieved, it is possible to output green light through the G sub-pixel without the color filter layer.

In the organic electroluminescent display apparatus according to the present disclosure, because a black matrix is not formed between color filters, a micro-sized display apparatus having a high resolution can be implemented.

In addition, in the organic electroluminescent display apparatus according to the present disclosure, a color filter of a sub-pixel is deleted and an air layer of a low refractive index is formed in the deleted position to totally reflect lights incident on interfaces with adjacent sub-pixels, so that it is possible to prevent staining caused by the mixing of different colored lights into said sub-pixel.

In addition, in the organic electroluminescent display apparatus according to the present disclosure, because lights incident to interfaces with a sub-pixel from which a color filter is removed from adjacent sub-pixels are totally reflected and output back to the adjacent sub-pixels, an intensity of the lights output to the adjacent sub-pixels are increased, thereby significantly improving a light efficiency.

Features, structures, effects and the like described in the above-described examples of the present disclosure are included in at least one example of the present disclosure but are not necessarily limited to only one example. Furthermore, features, structures, effects and the like illustrated in at least one example of the present disclosure may be combined or modified with respect to other examples by one of ordinary skill in the art to which the present disclosure belongs. Accordingly, contents related to such combinations and modifications should be interpreted as being included in the scope of the present disclosure.

The present disclosure described above is not limited to the above-described embodiments and the accompanying drawings, and it will be apparent to one of ordinary skill in the technical field to which this disclosure pertains that various substitutions, modifications and changes are possible within the scope not departing from the technical matters of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus, comprising:

a substrate;

a light emitting element formed on the substrate and configured to emit light of different colors via a plurality of sub-pixels;

a partial color filter layer formed on a first subset of the plurality of sub-pixels configured to output at least two of the different colors;

an air layer over a second subset of the plurality of sub-pixels over which the partial color filter layer is not formed, the second subset of the plurality of sub-pixels configured to output one of the different colors;

a first reflective electrode corresponding to the second subset of the plurality of sub-pixels; and a second reflective electrode corresponding to the first subset of the plurality of sub-pixels, wherein the first reflective electrode is at a first distance from the partial color filter layer, and wherein the second reflective electrode is at a second distance from the partial color filter layer, and the second distance is less than the first distance.

2. The display apparatus of claim 1, wherein the air layer has a different refractive index than a color filter of the partial color filter layer.

3. The display apparatus of claim 1, wherein the different colors include red, green, and blue colors, each of the plurality of sub-pixels correspond to one of the red, green, and blue colors, the first subset of the plurality of sub-pixels includes sub-pixels corresponding to two of the red, green, and blue colors, and the second subset of the plurality of sub-pixels includes sub-pixels corresponding to a remaining one of the red, green, and blue colors.

4. The display apparatus of claim 1, wherein the light emitting element comprises:

a plurality of first electrodes, each of the plurality of first electrodes corresponding to one of the plurality of sub-pixels;

a light emitting layer formed over an entire surface of the substrate to cover the plurality of first electrodes; and a second electrode formed over the light emitting layer.

5. The display apparatus of claim 4, further comprising:

a passivation layer;

an insulating layer formed over the passivation layer;

the first reflective electrode formed on the passivation layer corresponding to the second subset of the plurality of sub-pixels; and the second reflective electrode formed on the insulating layer corresponding to the first subset of the plurality of sub-pixels.

6. The display apparatus of claim 5, wherein an optical distance between the first reflective electrode and the second electrode is adjusted to cause constructive interference for light reflected between the first reflective electrode and the second electrode within a wavelength band of a color to be emitted from the second subset of the plurality of sub-pixels.

7. The display apparatus of claim 6, wherein the optical distance, when adjusted, causes destructive interference for all other lights within wavelength bands of colors other than the color.

8. The display apparatus of claim 4, further comprising:

a first insulating layer;

a passivation layer formed on the first insulating layer;

a second insulating layer formed on the passivation layer;

a first reflective electrode formed on the first insulating layer corresponding to the second subset of the plurality of sub-pixels; and a second reflective electrode formed on the second insulating layer corresponding to the first subset of the plurality of sub-pixels.

9. The display apparatus of claim 4, wherein the first reflective electrode is at a third distance from the second electrode, wherein the second reflective electrode is at a fourth distance from the second electrode, and the fourth distance is less than the third distance.

10. The display apparatus of claim 1, further comprising:

an encapsulation layer configured to prevent moisture from penetrating into the light emitting element.

11. The display apparatus of claim 1, further comprising:

a plurality of transistors, each of the plurality of transistors having an active region inside the substrate.

12. A display apparatus for displaying multimedia representing virtual and augmented reality, the display apparatus comprising:

a substrate;

a light emitting element formed on the substrate and configured to emit light of different colors via a plurality of sub-pixels to display the multimedia on the display apparatus; and a color filter layer over the light emitting element and including color filters corresponding to a first subset of the plurality of sub-pixels and an air layer corresponding to a second subset of the plurality of sub-pixels; and a plurality of reflective electrodes, wherein at least one of the plurality of reflective electrodes corresponding to the second subset of the plurality of sub-pixels is at a first distance from the color filter layer and remaining ones of the plurality of reflective electrodes corresponding to the first subset of the plurality of sub-pixels are at a second distance from the color filter layer, and wherein the second distance is less than the first distance.

13. The display apparatus of claim 12, further comprising:

a plurality of transistors, wherein each of the plurality of transistors form an active region inside the substrate.

14. The display apparatus of claim 12, wherein the color filter layer comprises:

a first color filter and a second color filter corresponding to the first subset of the plurality of sub-pixels.

15. The display apparatus of claim 14, wherein the air layer has a different refractive index than the first color filter and the second color filter.

16. The display apparatus of claim 12, wherein the different colors include red, green, and blue colors, each of the plurality of sub-pixels corresponds to one of the red, green, and blue colors, the first subset of the plurality of sub-pixels includes sub-pixels corresponding to two of the red, green, and blue colors, and the second subset of the plurality of sub-pixels includes sub-pixels corresponding to a remaining one of the red, green, and blue colors.

17. The display apparatus of claim 12, wherein the light emitting element comprises:

a plurality of first electrodes, each of the plurality of first electrodes corresponding to one of the plurality of sub-pixels;

a light emitting layer formed over an entire surface of the substrate to cover the plurality of first electrodes; and a second electrode formed over the light emitting layer.

18. The display apparatus of claim 17, wherein the plurality of reflective electrodes comprise:

at least two second reflective electrodes corresponding to the first subset of the plurality of sub-pixels; and a first reflective electrode corresponding to the second subset of the plurality of sub-pixels.

19. The display apparatus of claim 18, wherein an optical distance between the first reflective electrode and the second electrode is adjusted to cause constructive interference for light reflected between the first reflective electrode and the second electrode within a wavelength band of a color to be emitted from the second subset of the plurality of sub-pixels.

20. The display apparatus of claim 18, wherein the first reflective electrode is at a third distance from the second electrode, wherein the at least two second reflective electrodes are at a fourth distance from the second electrode, and the fourth distance is less than the third distance.

* * * * *